United States Patent [19]
Takahashi

[11] Patent Number: 6,157,203
[45] Date of Patent: Dec. 5, 2000

[54] INPUT CIRCUIT WITH IMPROVED OPERATING MARGIN USING A SINGLE INPUT DIFFERENTIAL CIRCUIT

[75] Inventor: Toshiro Takahashi, Hamura, Japan

[73] Assignee: Hitachi, Ltd., Tokyo, Japan

[21] Appl. No.: 08/985,175

[22] Filed: Dec. 4, 1997

[30] Foreign Application Priority Data

Dec. 6, 1996 [JP] Japan ..................... 8-342519

[51] Int. Cl.[7] .................. H03K 19/003; H03K 19/0175; H02H 3/22
[52] U.S. Cl. ................. 326/21; 326/23; 326/34; 326/68; 326/83; 361/111
[58] Field of Search ................. 326/22, 23, 24, 326/31, 33, 34, 83, 121, 68, 80, 81; 361/56, 111, 91, 118, 119

[56] References Cited

U.S. PATENT DOCUMENTS

| | | |
|---|---|---|
| 5,019,729 | 5/1991 | Kimura et al. ..................... 326/71 |
| 5,023,488 | 6/1991 | Gunning . |
| 5,659,513 | 8/1997 | Hirose et al. ..................... 365/206 |
| 5,796,281 | 8/1998 | Saeki et al. ..................... 327/206 |

OTHER PUBLICATIONS

Electronic–Industries–Association–of–Japan Standards EIAJ ED–5512, Mar., 1996 and English translation.

*Primary Examiner*—Michael Tokar
*Assistant Examiner*—James H. Cho
*Attorney, Agent, or Firm*—Beall Law Offices

[57] ABSTRACT

A semiconductor integrated circuit including an input circuit constituted as a single-input differential circuit which has a first MOSFET to whose gate a reception signal with a small amplitude with respect to a power supply voltage is supplied and a second MOSFET to whose gate a reference voltage corresponding to an intermediate value of the reception signal is supplied. A dummy circuit is provided and transmits substantially the same power supply noise as the power supply noise transmitted to the gate of the first MOSFET through a electrostatic protection circuit provided to an external terminal which receives the reception signal.

6 Claims, 9 Drawing Sheets

(C-D CROSS SECTION)

6,157,203

INPUT CIRCUIT WITH IMPROVED OPERATING MARGIN USING A SINGLE INPUT DIFFERENTIAL CIRCUIT

BACKGROUND OF THE INVENTION

The present invention relates to a semiconductor integrated circuit, particularly to a technique to be effectively used for a semiconductor integrated circuit using a small-amplitude interface such as a stub series terminated logic (SSTL) for 3.3 V.

The present inventor considers that a frequency of 60 MHz to 100 MHz at most is the limit of performance as a data transfer frequency because irregular reflection occurs at both ends of a signal transmission line in the case of a TTL (Transistor-Transistor Logic) or CMOS signal widely used as an interface between CMOS (Complementary Metal-Oxide Semiconductor) integrated circuits. In the case of the SSTL or a GTL (Gunning Transceiver Logic), however, the data transfer frequency is raised by connecting a terminating resistor to the end of a signal transmission line to prevent reflection of waveforms. In this case, the signal amplitude is set at approx. 0.8 V though the operating voltage of a semiconductor integrated circuit is 3.3 V. For the SSTL, there is the Electronic-Industries-Association-of-Japan Standards EIAJ ED-5512 (standard functional specifications of stub series terminated logics (SSTL-3) for 3.3 V) established in March, 1996. For the GTL, U.S. Pat. No. 5,023,488 (Jan. 11, 1991) is an example of its references.

SUMMARY OF THE INVENTION

The inventor of this application has noticed that the operating margin is deteriorated due to noise from a power supply line or earthing conductor when using a single-input differential circuit for judging the small-amplitude high/low level in accordance with a reference voltage as an input circuit for receiving the small-amplitude signal.

It is an object of the present invention to provide a semiconductor integrated circuit realizing a great improvement of the operating margin of an input circuit using a single-input differential circuit. The above and other objects and novel features of the present invention will become more apparent from the description of this specification and the accompanying drawings.

The outline of a representative of the aspects of the inventions disclosed in this specification will be briefly described below. That is, in an input circuit constituted, as a single-input differential circuit, of a first MOSFET (Metal-Oxide Semiconductor Field Effect Transistor) to whose gate a reception signal whose signal amplitude is decreased relative to a power supply voltage is supplied and a second MOSFET to whose gate a reference voltage corresponding to the intermediate value of the reception signal is supplied, a dummy circuit for transmitting power supply noise, substantially equivalent to the power supply noise transmitted to the gate of the first MOSFET through a substantial electrostatic protection circuit provided to an external terminal for receiving the reception signal, to the gate of a second MOSFET is provided.

DESCRIPTION OF THE PREFERRED EMBODIMENTS

Figure 1:
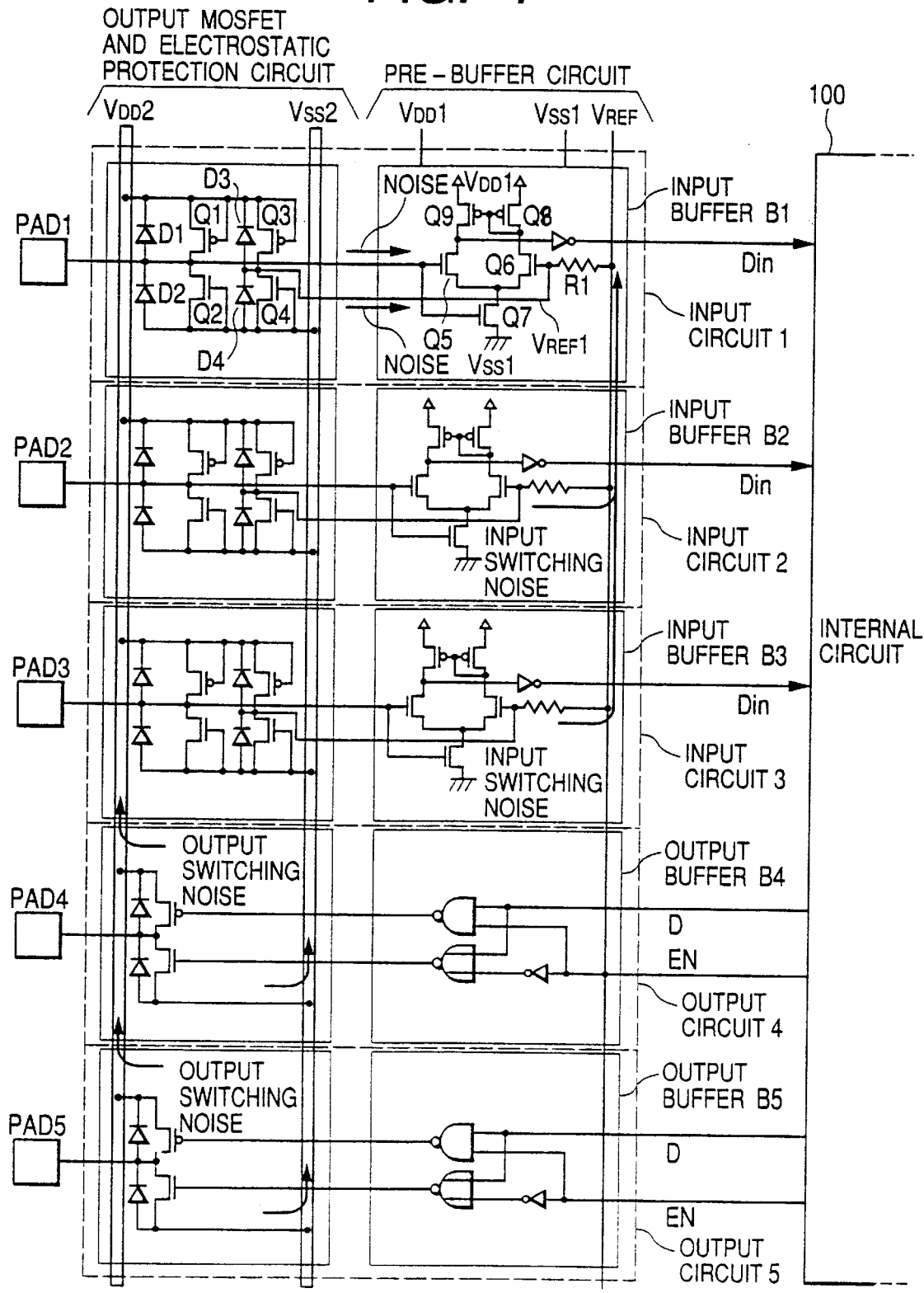
FIG. 1 is a circuit diagram showing an embodiment of an input/output circuit of a semiconductor integrated circuit according to the present invention.

FIG. 1 shows the circuit diagram of an embodiment of an input/output circuit of a semiconductor integrated circuit according to the present invention. The input/output circuit of FIG. 1 is so constituted as to conform to the SSTL-3 standards. Each circuit element of FIG. 1 is formed on a semiconductor substrate together with other circuit comprising a not-illustrated internal logic circuit and the like by a publicly-known CMOS integrated circuit fabrication technique.

In the case of this embodiment, power supply systems VDD2 and VSS2 of output MOSFETs and an electrostatic protection circuit are formed separately from power supply systems VDD1 and VSS1 of a pre-buffer circuit for driving output MOSFETs constituting an internal circuit 100, input circuits 1 to 3, and output circuits 4 and 5. Because of separation of the above power supply systems, the output circuits 4 and 5 are separated from the output MOSFETs and the pre-buffer circuit for driving the output MOSFETs, the output MOSFETs are connected to the power supply systems VDD2 and VSS2, and a gate circuit and an inverter circuit constituting the pre-buffer circuit are connected to the power supply systems VDD1 and VSS1 corresponding to the internal circuit.

FIG. 1 typically illustrates three input circuits 1 to 3 provided correspondingly to pads PAD1 to PAD3 and two output circuits 4 and 5 provided correspondingly to pads PAD4 and PAD5. MOSFETs Q1 and Q2 provided correspondingly to the pad PAD1 are used as elements constituting a part of the electrostatic protection circuit though they are provided to constitute an output circuit. That is, parasitic capacitances of a P-channel MOSFET Q1 and an N-channel MOSFET Q2 are used for electrostatic protection together with electrostatic protection diodes D1 and D2 by connecting the gate of the MOSFET Q1 to the power supply voltage VDD2, connecting the gate of an N-channel MOSFET Q2 to the ground potential VSS2 of the circuit so as to be normally off, and connecting the drain of the MOSFET Q2 to the pad PAD1.

To provide an input/output function to the pad PAD1, a pre-buffer circuit comprising a gate circuit like the output circuit 4 corresponding to the pad PAD1 and an inverter circuit is provided to the gates of the MOSFETs Q1 and Q2. Thus, when the pad PAD1 is provided with an input/output circuit, a high level is supplied to the gate of the P-channel MOSFET Q1 and a low level is supplied to the gate of the N-channel MOSFET Q2 from the pre-buffer, when the input/output circuit is viewed as the center, in other words when the state is a signal input state, the MOSFETs Q1 and Q2 are both turned off and the output circuit is brought to a high-impedance state. Therefore, it can be understood that the MOSFETs Q1 and Q2 of FIG. 1 show a state equivalent to the high-impedance sate. This holds for the MOSFETs of the pads PAD2 and PAD3 similarly to the above MOSFETs.

The input circuit 1 is of a differential form because the source of an N-channel MOSFET Q5 to whose gate a signal is supplied from the pad PAD1 and that of a P-channel MOSFET Q6 to whose gate a reference voltage VREF is applied are made common. The sources common to the MOSFETs Q5 and Q6 are provided with an N-channel MOSFET Q7 for supplying an operating current. Though not restricted, an input signal is supplied to the gate of the MOSFET Q7 from the pad PAD1. Moreover, the MOSFET Q7 can use a circuit for supplying a control signal to be turned on only when an input signal is supplied from the pad PAD1 in order to decrease the power consumption. The drains of the MOSFETsQ5 and Q6 are provided with P-channel MOSFETs Q8 and Q9 connected in a current mirror form.

Because the drain current of the MOSFET Q6 to whose gate the reference voltage VREF is applied is supplied to the drain of the MOSFET Q5 to whose gate the input signal is supplied through the MOSFETs Q8 and Q9 of the current Miller circuit, an output current corresponding to the drain current difference between the MOSFETs Q5 and Q6 is generated at the node between the MOSFETs Q8 and Q9 and thereby, the input capacity of an amplifying circuit comprising a CMOS inverter circuit or the like is charged or discharged and thereby, input signals Din having signal amplitudes corresponding to the power supply voltages VDD1 and VSS1 are generated through the amplifying circuit and supplied to the internal circuit.

Though not restricted, the reference voltage VREF is generated by a not-illustrated reference-voltage generation circuit and supplied to the input circuits through signal lines in common. In this case, the reference voltage VREF is applied to the gate of the MOSFET Q6 through a resistor R1 as shown in an input buffer B1 in order to eliminate the influence of coupling noise which will be mentioned later. Moreover, resistive elements similar to the above are provided for other input buffers B2 and B3.

In the case of this embodiment, to reduce the influence of power supply noise transmitted to the gate of the MOSFET Q5 constituting the input buffer B1, diodes D3 and D4 analogous to the electrostatic protection circuit added to the gate of the MOSFET Q5 and the MOSFETs Q3 and Q4 are added, as a dummy circuit, to the gate of the MOSFET Q6 to which the reference voltage VREF is applied. However, though the diodes D1 and D2 and the output MOSFETs Q1 and Q2 are constituted into a relatively large size for the original purpose of electrostatic protection and to obtain a large output current, the diodes D3 and D4 and the MOS-FETs Q3 and Q4 constituting the dummy circuit are deceased in size because they are used only to supply power supply noise equivalent to the power supply noise transmitted to the MOSFET Q5 through the electrostatic protection circuit to the gate of the MOSFET Q6. That is, they are decreased in size so that the size ratio between the MOSFETs Q1 and Q2 is equal to the size ratio between the MOSFETs Q3 and Q4, and the size ratio between the diodes D1 and D2 is equal to the size ratio between the diodes D3 and D4. Such a dummy circuit is provided for the input buffers B2 and B3 correspondingly to the pads PAD2 and PAD3.

Figure 2A:
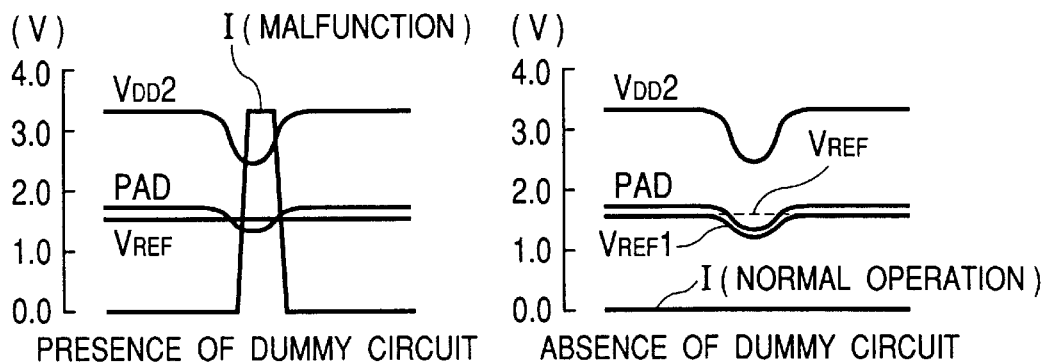
FIG. 2A is an operating waveform diagram of the input buffer shown in FIG. 1 when noise occur in the power supply voltage VVD2 of the input buffer.
Figure 2B:
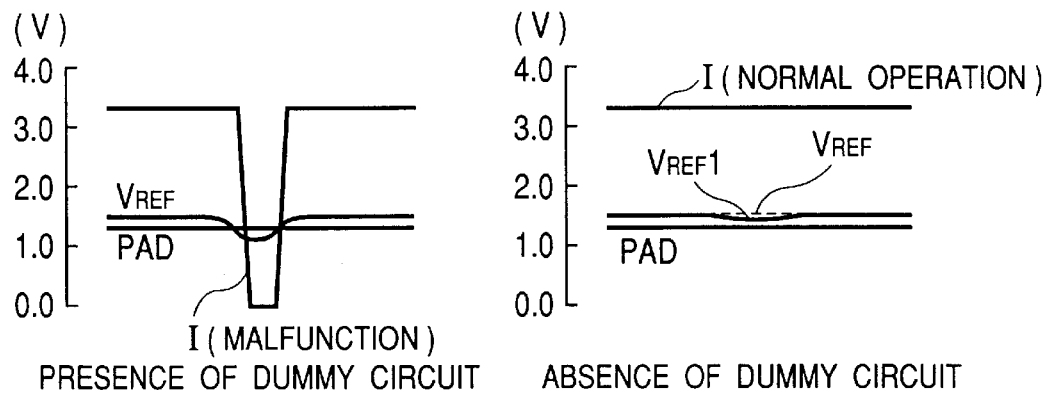
FIG. 2B is an operating waveform diagram of the input buffer shown in FIG. 1 when noise occur in the reference voltage VREF of the input buffer.
Figure 2C:
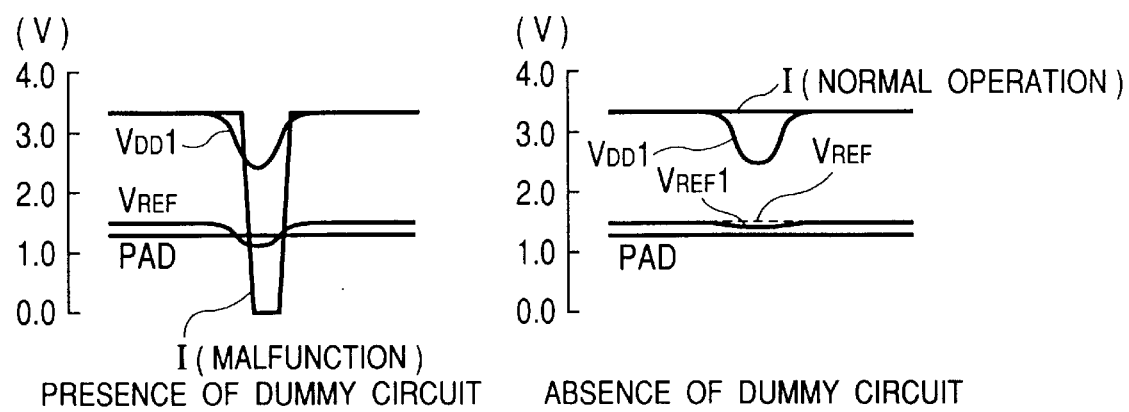
FIG. 2C is an operating waveform diagram of the input buffer shown in FIG. 1 when noise occur in the power supply voltage VDD1 on the internal circuit side shown in FIG. 1.

FIGS. 2A, 2B, and 2C show waveform diagrams for explaining the operation of the input buffers. In FIGS. 2A to 2C, a circuit not provided with the dummy circuit and a circuit provided with the dummy circuit are shown as circuits of the present invention, comparing their operation waveform diagrams for easy understanding of the present invention.

FIG. 2A shows a case in which noise occurs in the power supply voltage VDD2. That is, when output buffers B4 and B5 provided correspondingly to the pads PAD4 and PAD5 are brought into operating states and their output signals are changed from a low level to a high level, P-channel output MOSFETs are turned on and a large current instantaneously flows from the power supply voltage line VDD2 through the MOSFETs. In this case, relatively strong noise occurs in the power supply voltage line VDD2 due to the inductance component of the power supply voltage line VDD2. In the case of the SSTL, because the transmission line is connected to the reference voltage VREF through a terminating resistor, the high- or low-level signal generated by the above CMOS circuit is a small-amplitude signal like the above signal due to the resistance ratio between the terminating resistor and transmission line.

The noise generated in the power supply voltage line VDD2 is transmitted to the gate of the MOSFET Q5 of the input circuit through the substantial electrostatic protection circuit comprising the diodes D1 and D2 and the output MOSFETs Q1 and Q2. In this case, in a conventional circuit not provided with such a dummy circuit, when the input signal supplied from a pad PAD is kept at a high level with respect to the reference voltage VREF, the change of the signal to a low level due to power supply noise due to the inductance component of the power supply voltage VDD2 is transmitted to a pad PAD through the electrostatic protection circuit and inverted to a low level lower than the reference voltage VREF. That is, in the case of the SSTL, the above level inversion naturally occurs because the minimum difference between the reference voltage VREF and the high level is only approx. 0.2 V. As a result, in the case of an input circuit, a malfunction occurs that the output signal which should be at a low-level is temporarily changed to a high level.

Because the circuit of the present invention is provided with a dummy circuit, noise generated in the power supply voltage line VDD2 is transmitted almost equally to the gates of the MOSFETs Q5 and Q6 through the electrostatic protection circuit and dummy circuit. As a result, when the input signal supplied from a pad PAD is kept at a high level with respect to the reference voltage VREF, both voltages PAD and VREF1 of the input circuit are equally influenced by the noise and the relative level difference between the voltages is maintained. As a result, in the input circuit, the output signal which should be at low-level is kept at a low level even if the power supply noise occurs and the normal operation is performed.

In this case, though the gate voltage VREF1 of the MOSFET Q6 is changed due to the power supply noise as described above, the reference voltage VREF is not changed because the resistor R1 is used and therefore, not-illustrated other circuits are not affected. That is, when the power supply noise is relatively strong in an input circuit close to the above output circuit but the noise is weak in an input circuit away from the output circuit or hardly influences the input circuit, the input level margin may be deteriorated in other input circuit if the reference voltage VREF is changed. Therefore, the resistor R1 is used so that the power supply noise due to the dummy circuit become effective only in an input circuit provided with the dummy circuit.

Though not illustrated in FIG. 2A, a case in which noise occurs in the earthing conductor VSS2 of the circuit is also the same as the case in FIG. 2A. That is, when output buffers provided correspondingly to the pads PAD4 and PAD5 are brought into operating state and their output signals are changed from high to low levels, N-channel output MOSFETs are turned on and a large current instantaneously flows from the earthing conductor VSS2 through the output MOSFETs. In this case, relatively strong noise similar to the above occurs due to the inductance component of the earthing conductor VSS2. The noise output from the electrostatic protection circuit is-also offset by the above noise because the dummy circuit effectively functions. In this case, however, noise to be changed to positive potentials is superimposed on the earthing conductor VSS2. Therefore, when the input signal supplied from a pad PAD is kept at a low level with respect to the reference voltage VREF, both voltages PAD and VREF1 of the input circuit are equally influenced by the noise and the relative level difference between the voltages is maintained and resultingly, the output signal which should be at a high-level is kept at a high level even if the power supply noise occurs and therefore, the normal operation is performed.

FIG. 2B shows a case in which noise occurs in the reference voltage VREF. When signals of the pads PAD1 to PAD3 are simultaneously changed from high to low levels or low to high levels in the input buffers B1 to B3, the drain potentials of the differential MOSFETs Q5 and Q6 are simultaneously changed correspondingly to the change of the signal levels. In this case, the change of the drain voltages is transmitted to the gates of the MOSFETs Q5 and Q6 due to the parasitic capacitances between the drains and gates of the MOSFETs Q5 and Q6. However, the MOSFET Q5 is provided with the electrostatic protection circuit, and consequently the MOSFET Q5 has a relatively large parasitic capacitance. The parasitic capacitance is absorbed because it is regarded as a low-impedance power supply from the viewpoint of the noise.

In the case of a conventional circuit not provided with a dummy circuit, however, a reference voltage is changed correspondingly to the coupling noise because the reference voltage is applied through a relatively large wiring resistance. FIG. 2B shows a case in which the input signal is changed from high to low levels, the drain of the MOSFET Q5 is changed from low to high levels, and the drain of the MOSFET Q6 is changed from high to low levels. In the case of an input signal PAD, coupling noise from the drain of the MOSFET Q6 is absorbed by the parasitic capacitance of the electrostatic protection circuit. However, the reference voltage VREF is changed to a low level due to the coupling noise from the drain of the MOSFET Q6. When the level of the reference voltage VREF is lower than the level of the input signal PAD as shown in FIG. 2B, a malfunction occurs that the output signal which should be at a high-level is temporarily changed to a low level in an input circuit similarly to the above case or, when the deflection of the reference voltage VREF coincides with the phase of the input signal PAD, a trouble occurs that the delay in an input buffer is increased.

Because the circuit of the present invention is provided with a dummy circuit, the parasitic capacitance functions to absorb the coupling noise from the drain side of the MOSFET Q6 and decreases the change of the reference voltage VREF1 of the gate. As a result, it is possible to increase the signal margin of the input circuit.

FIG. 2C shows a case in which noise occurs in the power supply voltage VDD1 on the internal circuit side. In the internal circuit, signal levels are changed between the power supply voltage VDD1 and the earthing potential VSS1 of the circuit and pulsating noise similar to the above occurs due to simultaneous operation of the internal circuits. The noise is transmitted to the gates of the differential MOSFETs Q5 and Q6 through the parasitic capacitance between the drains and the gates of the P-channel MOSFET and differential MOSFET of the input circuit similarly to the case above mentioned Originally, because the power supply noise is transmitted to the differential MOSFETs Q5 and Q6 by a circuit similar to the above in a common mode, the noise should be offset by the differential circuit.

In the case of a single-input differential circuit, however, an electrostatic protection circuit is provided to the gate of the MOSFET Q5 on the input signal side and hence a relatively large parasitic capacitance is added thereto but, only the reference voltage VREF is applied to the gate of the MOSFET Q6 on the reference voltage side through the relatively large wiring resistor. Therefore, a difference occurs between the levels of the power supply noise transmitted to the gates of the MOSFETs Q5 and Q6 correspondingly to the imbalance between the parasitic capacitances connected to the gates of the MOSFETs Q5 and Q6 and the reference voltage side greatly fluctuates and resultingly, a malfunction similar to the above occurs.

Because the circuit of the present invention is provided with a dummy circuit, the parasitic capacitance of the dummy circuit serves so as to absorb the power supply noise generated in the power supply voltage line VDD1 when the noise is transmitted to the gates of the MOSFETs Q8 and Q6 through the parasitic capacitance between the drains and the gates of the MOSFETs Q8 and Q6 and decreases the change of the reference voltage VERF1 of gates. As a result, it is possible to increase the signal margin of the input circuit similarly to the above described.

Figure 3:
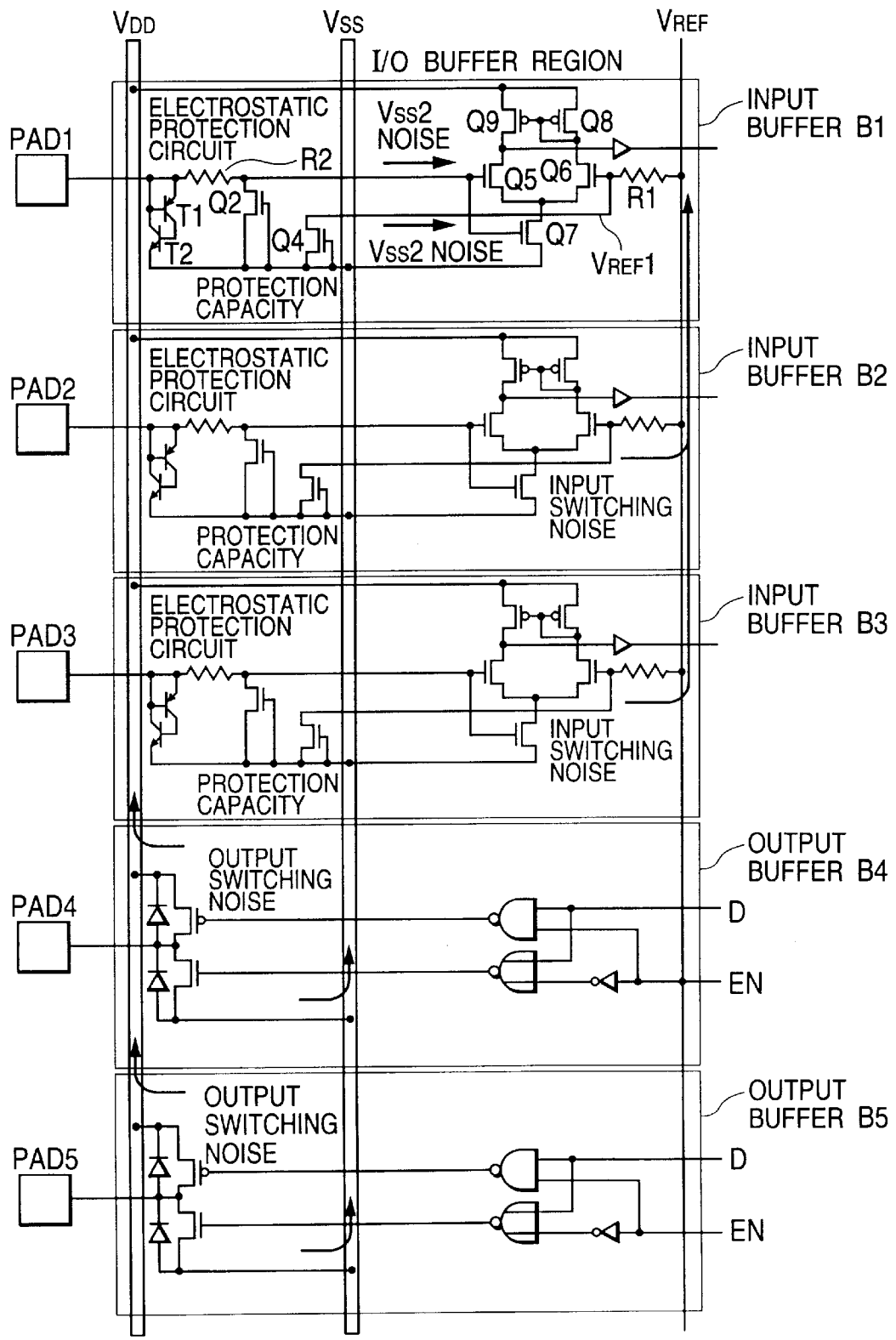
FIG. 3 is a circuit diagram showing another embodiment of an input/output circuit of a semiconductor integrated circuit according to the present invention.

FIG. 3 shows the circuit diagram of another embodiment of an input/output circuit of a semiconductor integrated circuit of the present invention. Though not restricted, the input/output circuit of FIG. 3 is used for a semiconductor memory or the like. In the case of the semiconductor memory or the like, a power supply voltage line is shared by an output circuit and an input circuit because of the restriction on the number of pins or the like. Therefore, input buffers 1 to 3 and output buffers 4 and 5 are connected to the same power supply voltage line VDD and the earthing conductors VSS of the circuits.

In the case of this embodiment, an electrostatic protection circuit provided to pads PAD1 to PAD3 corresponding to input buffers B1 to B3 uses a thyristor system. That is, a thyristor device comprising transistors T1 and T2 is provided on the pad PAD1 side and a diode-connected MOSFET Q2 is provided on the gate side of a differential MOSFET Q5 through a resistor R2. Because such an of electrostatic protection circuit is provided between the pad PAD1 and the earthing conductor VSS of the circuit, noise generated in the earthing conductor VSS is transmitted to the gate of the MOSFET Q5. Therefore, a dummy circuit is connected to the gate of a differential MOSFET Q6 in which a MOSFET Q4 corresponding to the MOSFET Q2 receives a reference voltage VREF.

Noise generated in the power supply voltage VDD is transmitted to the gates of the MOSFETs Q5 and Q6 through the parasitic capacitances between the drains and gates of P-channel MOSFETs Q8 and Q9 and differential MOSFETs of the differential circuit. However, because each one is an in-phase signal and the parasitic capacitance viewed from the gates of the MOSFETs Q5 and Q6 is offset by the differential circuit because a parasitic capacitance is similarly added by the MOSFETs Q2 and Q4 and thereby, the balance is not greatly broken, exceeding the signal level difference to the reference voltage. The relation between the MOSFET Q2 for electrostatic protection and the dummy MOSFET Q4 also effectively works on the noise due to the change of drain voltages of the MOSFETs Q5 and Q6 of the input circuit similarly to the above mentioned.

Figure 4:
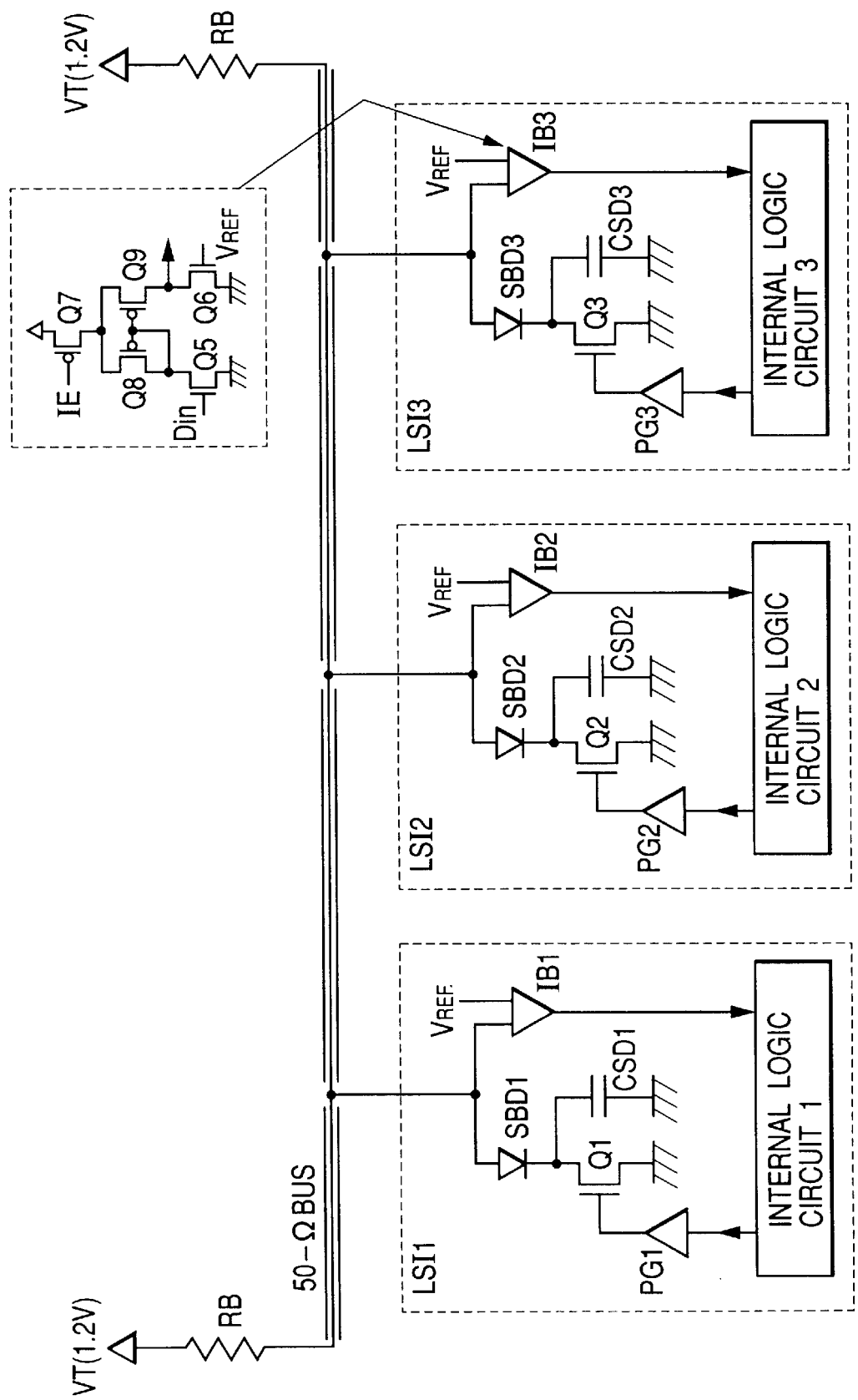
FIG. 4 is a block diagram showing a semiconductor integrated circuit of an embodiment according to the present invention and the bus structure of an information processing system using the circuit.

FIG. 4 shows a block diagram of semiconductor integrated circuits of an embodiment of the present invention and the bus structure of an information processing system using the semiconductor integrated circuits. In FIG. 4, semiconductor integrated circuits LSI1 to LSI3 enclosed by dotted lines are formed on a semiconductor substrate made of, for example, single-crystal silicon by a known semiconductor integrated circuit fabrication technique. In the case of this embodiment, the input/output circuit is so constituted as to be adaptable to a GTL. Among circuit devices of FIG. 4, input circuits are so shown as to fit with the circuit elements of FIGS. 1 and 3. However, it should be understood that other elements have other circuit functions.

The semiconductor integrated circuits LSI1 to LSI3 each comprise an input/output buffer and an internal logic circuit which are typically shown. For example, in the case of the semiconductor integrated circuit LSI1, the output buffer comprises a driving circuit PG1, an output MOSFET Q1 having an open drain structure, and a diode SBD1 connected between the drain of the output MOSFET Q1 and an external terminal. Though not restricted, the diode used is a Schottky diode because it has a small parasitic capacitance and moreover, it is advantageous to realize a high integration degree because it can be integrally formed with a drain contact hole in order to increase the operation speed as described later.

The input circuit comprises an input buffer IB1 in a differential form to judge the input signal in accordance with the reference voltage VREF. An internal logic circuit 1 receives input data supplied from the input buffer IB1, processes the data, and transmits signals to other semiconductor integrated circuits LSI2 and LSI3 through the output buffer when necessary. The semiconductor integrated circuits LSI2 and LSI3 also comprise the same circuit as the above However, not all the circuits are the same. It is possible to vary the number of input buffers or the number of output buffers in accordance with the function or role of each of the semiconductor integrated circuits LSI1 to LSI3. An internal logic circuit is constituted in accordance with each function.

Though not restricted, a bus for transfer data between the semiconductor integrated circuits LSI1, LSI2, and LSI3 is constituted of the wiring formed on a mounting board such as a printed circuit board and used as a 50-Ω bus. The terminating end of the bus is connected with a resistor RB matched with the characteristic impedance of the bus wiring and a voltage VT such as 1.2 V is applied to the terminating end.

In the case of the semiconductor integrated circuit LSI1, the output MOSFET Q1 is made to have a large diffusion layer so as to increase the electrostatic breakdown voltage. Therefore, a parasitic capacitor having a large capacitance is formed on the drain of the MOSFET Q1. If the drain of the output MOSFET Q1 is directly connected to an external terminal, the characteristic impedance of the bus wiring to which the terminal is connected is disturbed, irregular reflection occurs in a signal waveform, and the delay time is equivalently lengthened. For example, when semiconductor integrated circuits having a pin capacitance of 8 pF are connected to a 50-Ω bus wiring at intervals of approx. 8 cm, mismatching of 20% or more occurs. As a result, even if the wiring is terminated by the bus resistor RB, large irregular reflection occurs nearby the portions where external pins of the semiconductor integrated circuits are connected.

In the case of this embodiment, though not restricted, by connecting the Schottky diode SBD1 between the drain of the output MOSFET Q1, and the external terminal, the parasitic capacitance of the Schottky diode SBD1 and the parasitic capacitor CSD1 of the drain of the output MOSFET Q1 are connected to each other in series. As a result, the parasitic capacitance viewed from the external terminal can be decreased almost to 0 depending on the parasitic capacitance of the Schottky diode SBD1 when the diode SBD1 is off.

In FIG. 4, when the output MOSFETs Q1 to Q3 of the semiconductor integrated circuits LSI1 to LSI3 are off, the potential of the bus is set at the VT level of 1.2 V. When one or a plurality of the output MOSFETs in the semiconductor integrated circuits LSI1 to LSI3 are turned on, the potential is brought close to the earthing potential VSS such as 0.4 V. Therefore, to transfer data from the semiconductor integrated circuit LSI1 to the semiconductor integrated circuit LSI3, the output MOSFETs Q2 and Q3 of the semiconductor integrated circuits LSI2 and LSI3 are turned off and the output MOSFET Q1 of the semiconductor integrated circuit LSI1 is turned on/off in accordance with the internal signal to be output, thereby to transmit the above high- or low-level data.

In the case of the semiconductor integrated circuits LSI2 and LSI3 in which the output MOSFETs Q2 and Q3 of output buffers are off, parasitic capacitors CSD2 and CSD3 of drains are charged up to a level close to VT due to the rebound when a bus becomes high-level. Therefore, even after the bus level is changed to a low level, Schottky diodes SBD2 and SBD3 are off. Therefore, these parasitic capacitors CSD2 and CSD3 cannot be seen from the bus wiring side. Moreover, in the case of the semiconductor integrated circuit LSI1 which is repeatedly turned on and off, the parasitic capacitor CSD1 is connected with the bus wiring because the Schottky diode SBD1 is also turned on at the timing at which the output MOSFET Q1 is on. However, at the timing at which the output MOSFET Q1 is off, the parasitic capacitance CSD1 is charged up to VT at the first rise immediately after the Q1 is turned off. Therefore, the Schottky diode SBD1 is turned off, making the parasitic capacitor CSD1 invisible from the bus wiring side.

That is, the parasitic capacitor CSD1 to CSD3 having very large capacitances are not connected to the bus wiring but a parasitic capacitor CSD corresponds to an output buffer in a operating state or it cannot be seen from the bus wiring like the case of this embodiment. As a result, for a signal waveform transmitted through the bus wiring, the vibration due to irregular reflection can be greatly reduced and thus, the equivalent signal delay is shortened. Therefore, it is possible to increase the signal transfer rate. Moreover, the electrostatic withstand voltage when handing the semiconductor integrated circuit LSI1 as a simple device is changed to a voltage of VSD1=Q/CSD1 because the electric charge Q accumulated in an external terminal is transmitted to the parasitic capacitor CSDL of the drain through the Schottky diode SBD1. Thereby, it is possible to set the electrostatic withstand voltage at a large value.

In the case of the above GTL circuit, the signal amplitude is biased to the earthing potential side. Therefore, in the case of the input buffer IB3, an input signal Din is supplied to the N-channel MOSFET Q5 whose source is connected to the earthing potential and the reference voltage VREF is supplied to the gate of the N-channel MOSFET Q6 whose source is connected to the earthing potential. Moreover, to take out the difference between the drain currents of these two MOSFETs Q5 and Q6 as an output current, P-channel MOSFETs Q8 and Q9 connected in a current Miller form are used. Though not restricted, an operating voltage is applied to the MOSFETs Q8 and Q9 of the above current Miller circuit through a P-channel MOSFET Q7 serving as a power supply switch. That is, the MOSFET Q7 in an output-operation or chip non-selection state is turned off by a signal IE, so that no direct current flows through the input circuit.

Other input circuits IB1 and IB2 each comprise a differential circuit similarly to the above. The input circuits IB1 to IB3 are each provided with a dummy circuit corresponding to the form of an electrostatic protection circuit connected to an input terminal similarly to the case of the embodiments in FIGS. 1 and 3, so that noise transmitted from the power supply voltage line or the earthing line of a circuit and superimposed on the gates of the MOSFETs Q5 and Q6 performing the differential operation are offset or reduced.

Figure 5:
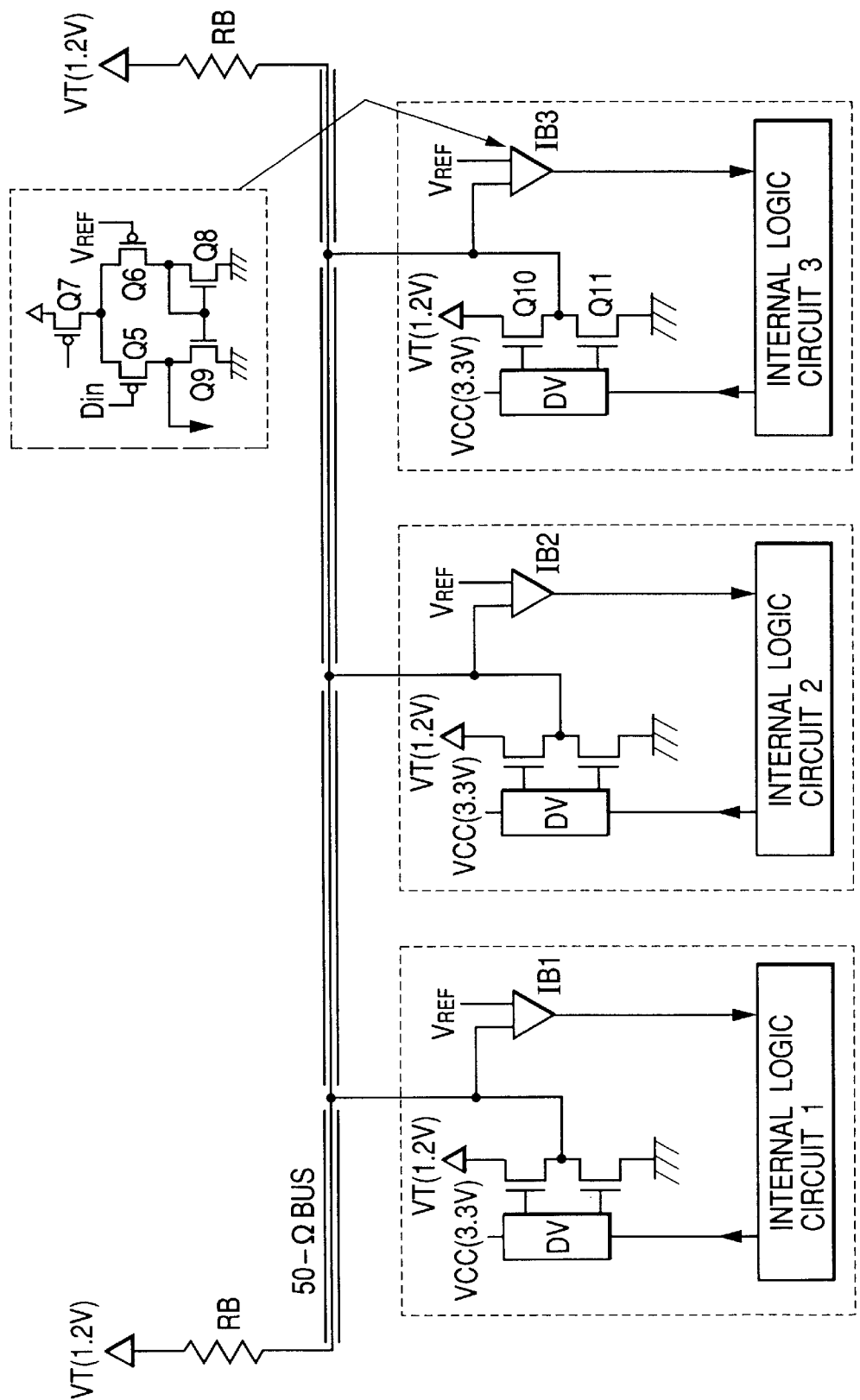
FIG. 5 is a block diagram showing a semiconductor integrated circuit of another embodiment according to the present invention and the bus structure of an information processing system using the circuit.

FIG. 5 shows a block diagram of semiconductor integrated circuits of another embodiment of the present invention and the bus structure of an information processing system using the semiconductor integrated circuits. In FIG. 4, the semiconductor integrated circuits LSI1 to LSI3 enclosed by dotted lines are formed on a semiconductor substrate made of, for example, single-crystal silicon by a known semiconductor integrated circuit fabrication technique. In the case of this embodiment, an input/output circuit is basically so constituted as to be adaptable to a GTL. However, the input circuit and output circuit are different from those of the embodiment in FIG. 4.

In the case of this embodiment, the output circuit is of a push-pull type using N-channel MOSFETs Q10 and Q11 in stead of the open-drain output type used in the case of the preceding embodiment. That is, a high-level output signal is obtained by operating the output circuit at a voltage of 1.2 V equal to the above terminating voltage VT, not setting the output signal at a high level by the terminating resistor RB of a bus. Because the internal circuit is operated at 3.3 V as described above, it is possible to set the gate voltage for turning on the N-channel MOSFET Q10 at a large value such as 3.3 V. Therefore, it is possible to generate a high-level output signal of 1.2 V while using the N-channel MOSFET Q10. Thereby, it is possible to accelerate the rise of an output high level and stably change it to the high level.

An input circuit IB3 uses a P-channel differential MOSFETs Q5 and Q6 correspondingly to the fact that the input level is biased to the low level side. That is, the input signal Din is supplied to the gate of the P-channel MOSFET Q5, and the reference voltage VERF is supplied to the gate of the P-channel MOSFET Q6. Moreover, N-channel MOSFETs Q8 and Q9 of a current mirror form are provided on the drain sides of the MOSFETs Q5 and Q6 to generate an output current corresponding to the difference between the drain currents of the MOSFETs Q5 and Q6. A P-channel MOSFET Q7 for supplying an operating current is provided between the source and power supply voltage common to the MOSFETs Q5 and Q6. That is, the differential circuit is constituted by using MOSFETs having opposite conductivity types to those of the input circuits of FIGS. 1 and 3.

Other input circuits IB1 and IB2 are also constituted of the same differential circuits as those of the above differential circuit. These input circuits IB1 to IB3 are each provided with a dummy circuit corresponding to the form of the electrostatic protection circuit connected to an input terminal similarly to the case of the embodiments of FIGS. 1 and 3, so that noise transmitted from the power supply line or earthing line of the circuit and superimposed on the gates of the MOSFETs Q5 and Q6 performing the differential operation are offset or reduced.

Figure 6:
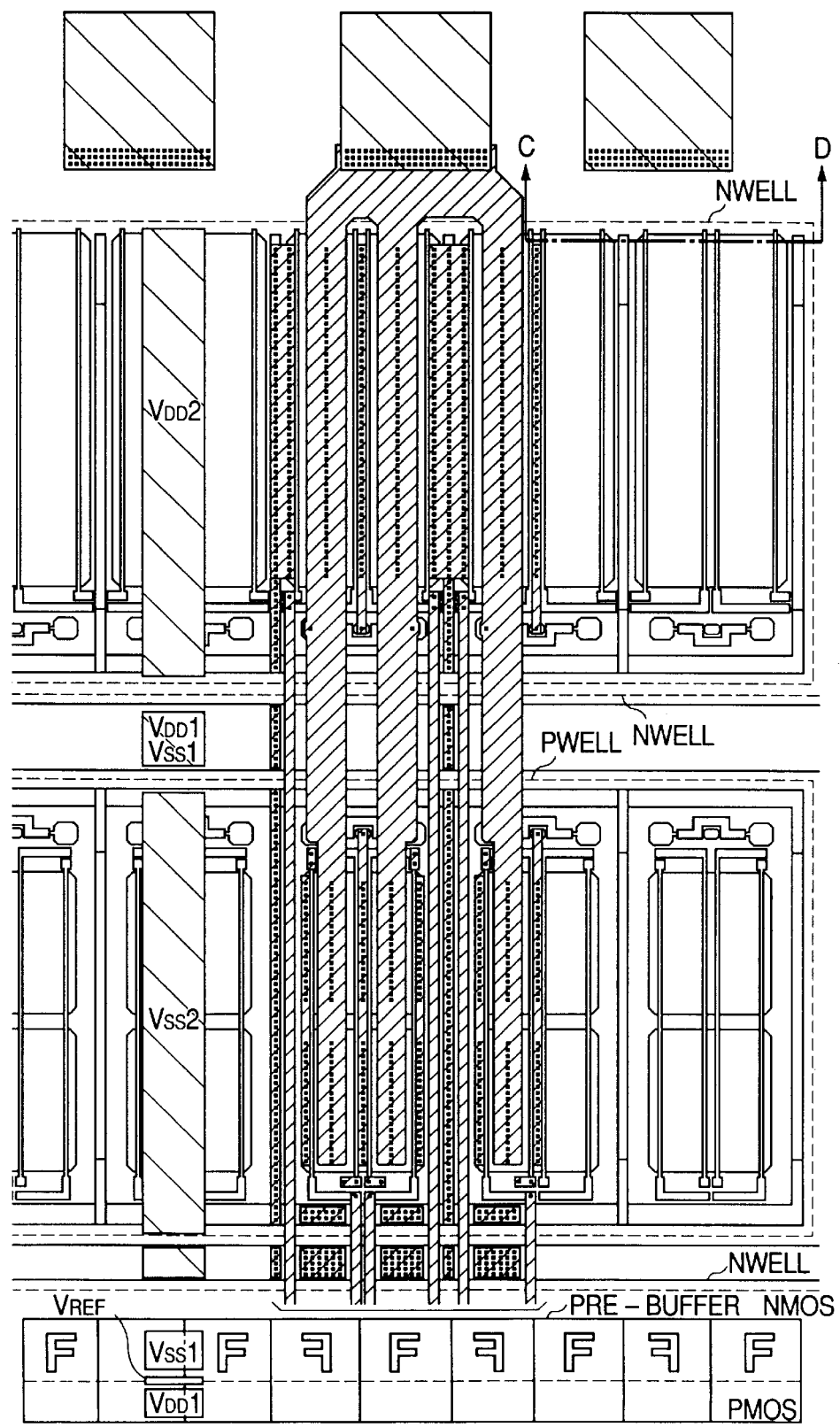
FIG. 6 is a layout diagram showing the whole of an embodiment of a CMOS-structure output circuit.

FIG. 6 shows the layout of the whole of an embodiment of the above output circuit having a CMOS structure. FIG. 6 illustrates three bonding pads and three CMOS output circuits connected to the bonding pads. Assuming that the bonding pads are horizontally arranged, P-channel MOSFET and N-channel MOSFET are downward arranged side by side. Moreover, the drains, gates, and sources of these MOSFETs are provided in the arrangement direction of the bonding pads. Therefore, it is possible to form one MOSFET longitudinally, so that the arrangement pitch of the bonding pads can be shortened As understood from FIG. 6, four MOSFETs are so formed that they are bilaterally symmetric with respect to an No diffusion layer for supplying a bias voltage in a well region of a P+ diffusion layer constituting a P-channel MOSFET, and bilaterally symmetric with respect to the boarder line with an output buffer provided correspondingly to an adjacent bonding pad. By combining these symmetric patterns, it is possible to form MOSFETs constituting an output buffer at a high density.

By previously forming the above diffusion layers and gate electrodes and selectively connecting the six MOSFETs by a master slice using the final wiring of aluminum or the like by using two out of the six MOSFETs as a minimum I/O cell unit, in other words, by selectively forming one of the three branches among up to three wirings extending and branched from the above bonding pads, it is possible to obtain a CMOS output circuit to which the driving capacity can be set at three levels of 1, 2, and 3.

In the case of this embodiment, it is easily possible to decrease the pitches between bonding pads up to 90 $\mu$m without extremely deteriorating the output driving capacity. Thereby, in the case of only output terminals, it is possible to increase the number of output terminals which can be provided to a semiconductor integrated circuit up to 160/90=1.8 of a conventional semiconductor device.

In FIG. 6, a pre-buffer is provided under the N-channel MOSFET provided on the lower side. The pre-buffer can be relatively freely formed without any restriction on the pitch between bonding pads by forming it into a longitudinally oblong shape because the cell size of the pre-buffer is relatively small. However, the pre-buffer is also cellulated correspondingly to the fact that the output circuits are regularly arranged in a certain direction and the direction of the cells are regularly formed so as to correspond to the regularity of output buffers. Thereby, it is possible to efficiently mount output circuits including a pre-buffer on a semiconductor integrated circuit.

In the case of this embodiment, a P-channel pull-up MOSFET is formed in an N-type well region NWELL where a P-channel MOSFET is formed. As described above, minimum unit cells are two MOSFETs corresponding to three branched wirings and a pull-up MOSFET is formed correspondingly to these two MOSFETs. The pull-up MOSFET is used as a load when using a wired logic with the output MOSFET of another semiconductor device when an output circuit having an open drain structure using an N-channel MOSFET is used as an output buffer.

An N-channel pull-down MOSFET similar to the above is also formed in a P-type well region PWELL where the N-channel MOSFET is formed. This is used as a load when constituting an output circuit having an open drain structure by using only a P-channel MOSFET. Though not restricted, the PWELL where the N-channel MOSFET is formed is formed in a deep NWELL surrounded by a dotted line outside the PWELL. The PWELL is isolated from a P-type substrate by the deep NWELL and therefore, it is possible to isolate power supply noise between the PWELL and an internal circuit or between input circuits or output circuits.

A power supply voltage line VDD2 made of a thick wiring formed of a second aluminum layer is formed over the upper layer of the P-channel output MOSFET. Similarly, an earthing conductor VSS2 made of a thick wiring formed of a second aluminum layer is formed over the upper layer of the P-channel output MOSFET. Moreover, the earthing conductor VSS1, reference voltage VREF, and power supply voltage line VDD1 of a circuit formed of a second aluminum layer are formed over the upper layer of the pre-buffer. Moreover, the output MOSFET, electrostatic protection circuit, dummy circuit, pre-buffer, and a differential input circuit though this is not illustrated in FIG. 6 are connected by a first aluminum layer.

Figure 7:
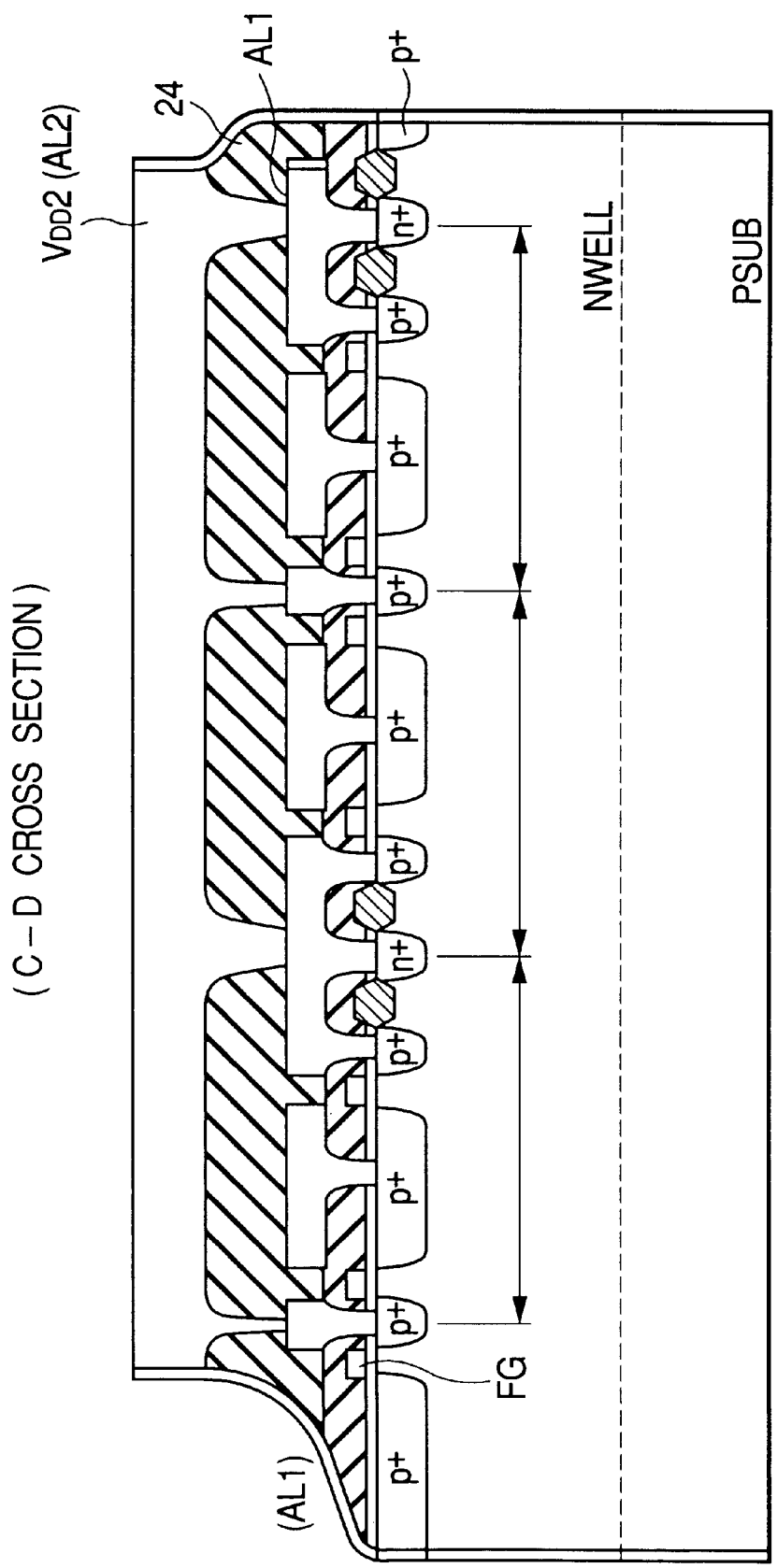
FIG. 7 is a sectional view showing the structure of part of elements of FIG. 6.

FIG. 7 shows a sectional view of the device of FIG. 6, taken along the ling C–D in FIG. 6. FIG. 7 shows six P-channel MOSFETs. In the case of the six P-channel MOSFETs in FIG. 7, a source, drain, source, drain, and source are arranged in this order from the top, and the drains are formed of a large diffusion layer and the sources are formed of a small diffusion layer. That is, sources or drains are used for drains or sources arranged on both sides of the former source or drain in common, excepting the end portions Thereby, it is possible to form a total of four MOSFETs using five diffusion layers.

An n⁺ layer serving as an ohmic contact region for applying a bias voltage to the well-region n-WELL is formed on both sides of the diffusion layers with the arrangement of the five diffusion layers used as a unit, and VDD2 is applied to the n⁺ layer through a first-layer aluminum AL1 and a second-layer aluminum AL2 together with a p⁺ layer constituting the above source. Four MOSFETs interposed between the no layer are led to the pads through the first aluminum layer as substantially one MOSFET comprising two MOSFETs whose drain is made common.

Figure 8:
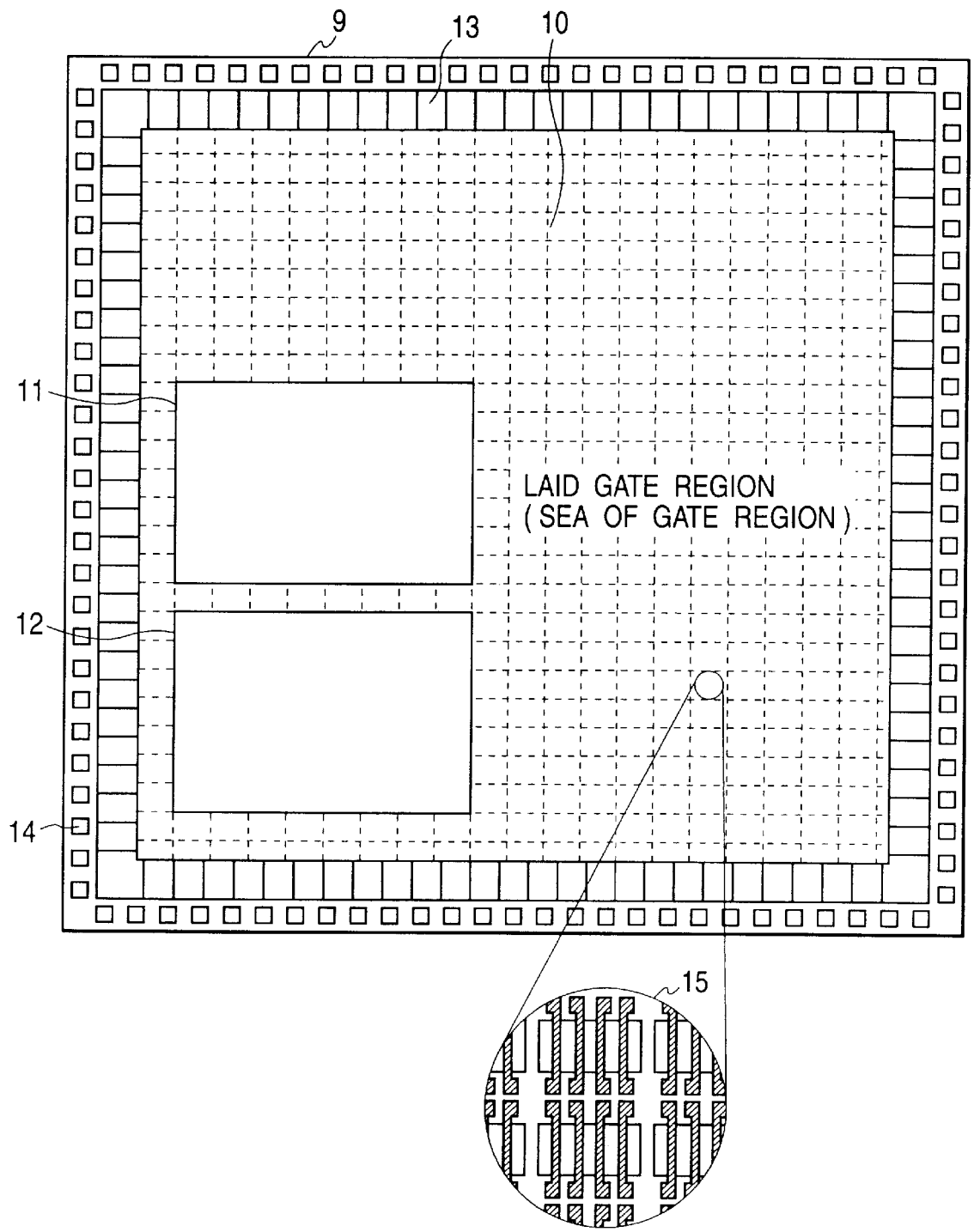
FIG. 8 is a block diagram showing an embodiment of a semiconductor integrated circuit of the present invention.

FIG. 8 shows a block diagram of an embodiment of a semiconductor integrated circuit of the present invention. Each circuit block of FIG. 8 is drawn in accordance with a geometric layout on an actual semiconductor substrate. In FIG. 8, numeral 9 denotes a semiconductor chip and 10 denotes an internal circuit comprising on-chip RAMs 11 and 12 and a logic circuit section other the RAMs 11 and 12. Though not restricted, each of the on-chip RAM 11 and 12 is a static RAM. The region in which the internal circuit 10 is formed is a laid gate region other than a RAM block. MOSFETs are laid as shown by an enlarged pattern 15 of the region, wiring is formed by a master slice method, and a desired circuit function is realized. Bonding pads 14 are provided around the semiconductor chip 9 and an input/output circuit section 13 is provided between the bonding pads 14 and the internal circuit 10. The input/output circuit 13 serves as an interface for inputting/outputting a small-amplitude signal such as the STL or GTL and an input circuit uses a single-input differential circuit.

Figure 9:
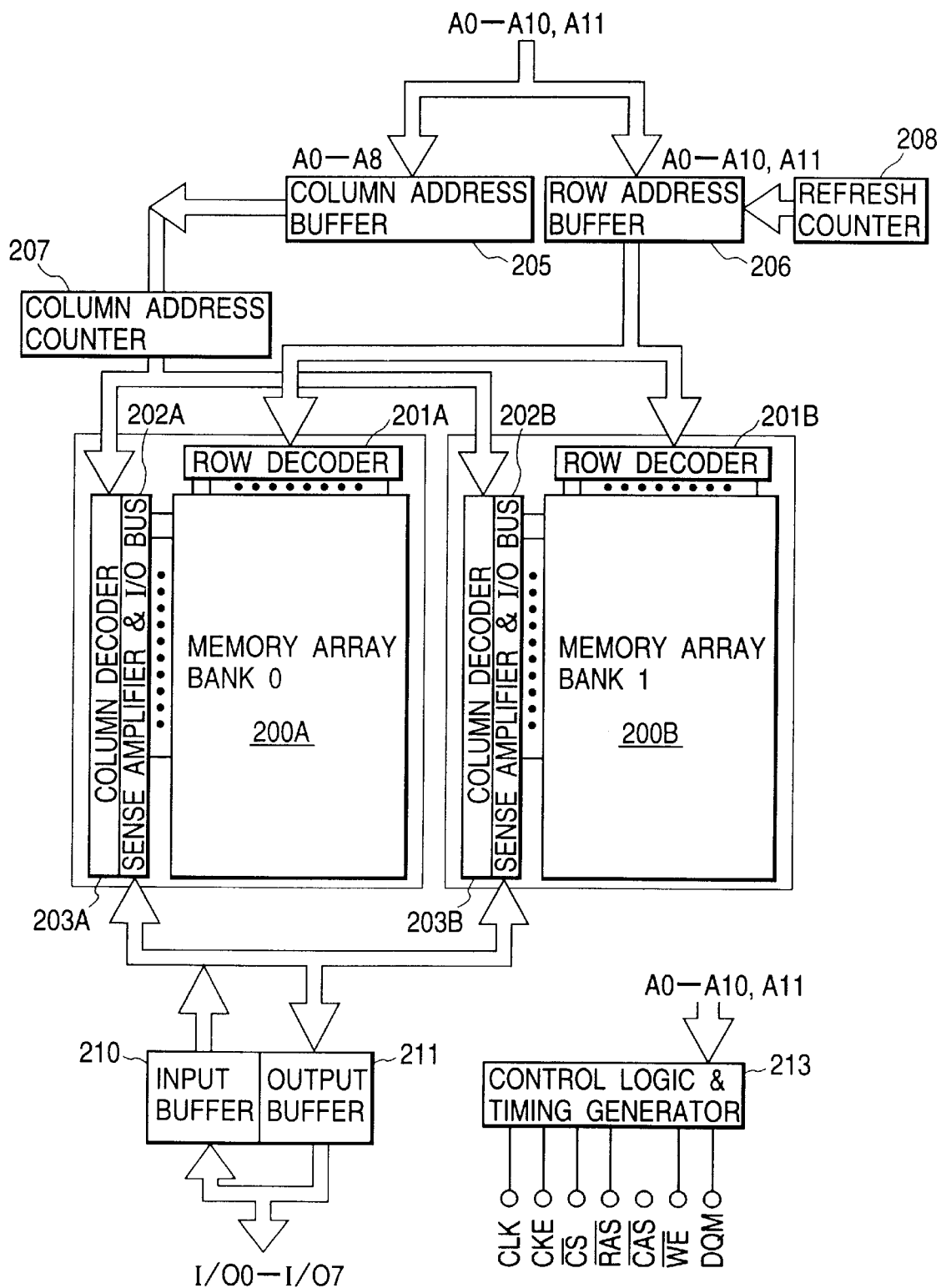
FIG. 9 is a schematic block diagram showing an embodiment of a synchronous DRAM to which the present invention is applied.

FIG. 9 shows a schematic block diagram of an embodiment of a synchronous DRAM (hereafter referred to as SDRAM) to which the present invention is applied. Though not restricted, the SDRAM shown in FIG. 9 is formed on a semiconductor substrate made of, for example, single-crystal silicon by a known semiconductor integrated circuit fabrication technique.

The SDRAM of this embodiment is provided with a memory array (MEMORY ARRAY) 200A constituting a memory bank 0 (BANK 0) and a memory array (MEMORY ARRAY) 200B constituting a memory bank 1 (BANK 1). The memory arrays 200A and 200B are each provided with dynamic memory cells arranged like a matrix. In FIG. 9, selection terminals of the memory cells arranged in the same column are connected to a word line (not illustrated) for each column, and data input/output terminals of the memory cells arranged in the same row are connected to a complimentary data line (not illustrated) for each row.

One of not-illustrated word lines of the memory array 200A is driven to a selection level in accordance with the result of the result of decoding a row address signal by a row decoder (ROW DECODER) 201A. Not-illustrated complimentary data lines of the memory array 200A are connected to a sense amplifier column selection circuit (SENSE AMPLIFIER & I/O BUS) 202A. The sense amplifier (SENSE AMPLIFIER) of the sense amplifier column selection circuit 202A is an amplifying circuit for detecting and amplifying a very small potential difference appearing on each complimentary data line by reading data from memory cells. A column switching circuit in the sense amplifier is a switching circuit for selecting each complementary data lie and electrically connecting it to a complementary common data line (I/O BUS). The column switching circuit is selectively operated in accordance with the result of decoding a column address signal by a column decoder (COLUMN DECODER) 203A.

A row decoder (ROW DECODER) 201B, a sense amplifier column selection circuit (SENSE AMPLIFIER & I/O BUS) 202B, and a column decoder (COLUMN DECODER) 203B are provided on the memory array 200B similarly to the above mentioned. The complementary common data line (I/O BUS) between the memory banks 200A and 200B is connected to the output terminal of an input buffer (INPUT BUFFER) 210 and the input terminal of an output buffer (OUTPUT BUFFER) 211 through a shift register (SHIFT REGISTER) 212 used for the image processing to be described later. The input terminal of the input buffer 210 and the output terminal of the output buffer 211 are connected to 8-bit data input/output terminals I/O0 to I/O7.

Row address signals and column address signals supplied from address input terminals A0 to A11 are captured by a column address buffer (COLUMN ADDRESS BUFFER) 205 and a row address buffer (ROW ADDRESS BUFFER)

206 in an address multiplexing form. The supplied address signals are held by buffers 205 and 206. The row address buffer 206 captures a refresh address signal output from a refresh counter (REFRESH COUNTER) 208 as a row address signal. The output of the column address buffer 205 is supplied as preset data of a column address counter (COLUMN ADDRESS COUNTER) 207. The column address counter 207 outputs a column address signal representing the preset data or the value obtained by successively incrementing the column address signal to the column decoders 203A and 203B.

Though not restricted, a controller (CONTROL LOGIC & TIMING GENERATOR) 213 receives external control signals such as a clock signal CLK, clock enable signal CKE, chip select signal /CS, column address strobe signal /CAS (symbol "/" represents that a signal to which the symbol "/" is attached is a row enable signal), row address strobe signal /RAS, write enable signal /WE, and data input/output mask control signal DQM, control data sent from the address input terminals A0 to A11 and reference voltage Vref, and generates internal timing signals for controlling the operation mode of the SRAM and the operation of the circuit block in accordance with the change of the levels of these signals and their timing. Therefore, the controller 213 is provided with a control logic and a mode register for generating the internal timing signal.

The clock signal CLK serves as a master clock of the SDRAM and other external input signals are made significant in synchronizm with the leading edge of the internal clock signal. The chip select signal /CS orders the start of a command input cycle at its low level. The case in which the chip select signal /CS when it is high-level (chip non-selection state) and other inputs do not make sense. However, a memory bank selection state and an internal operation such as a burst operation to be mentioned later are not influenced by the change to the chip non-selection state. The signals /RAS, /CAS, and /WE are different from the corresponding signals in a normal DRAM in function and significant when defining the command cycle to be mentioned later.

The clock enable signal CKE is a signal for designating the effectiveness of the next clock signal. The leading edge of the next clock signal CLK is effective when the signal CKE is at a high level but it is ineffective when the signal CKE is at a low level. Moreover, though not illustrated, an external control signal for performing the control of output enable for the output buffer 211 is also supplied to the controller 213 in a read mode, and the output buffer 211 is brought to a high-output impedance state when the signal is at, e.g., a high-level.

The row address signal is defined by the level of A0 to A10 in the row-address-strobe bank active command cycle to be mentioned later which synchronizes with the leading edge of a clock signal CLK (internal clock signal). An input from A11 is regarded as a bank selection signal in the row-address-strobe bank active command cycle. That is, a memory bank BANKA is selected when the input from A11 is at a low level, and a memory bank BANKB is selected when it is at a high-level. Though not restricted, selective control of a memory bank can be performed in accordance with the processing such as activation of only a row decoder on the selected memory bank side, non-selection of every column switching circuit on the non-selected memory bank side, or connection of only the selected memory bank side to the input buffer 210 and output buffer 211.

An input of A10 in the precharge command cycle to be mentioned later designates the mode of precharging a complementary data line. The high level of the input designates that objects to be precharged are both memory banks and the low level of the input designates that one memory bank designated by A11 is an object to be precharged.

The column address signal is defined by the levels of A0 to A8 in the read or write command (column address read command or column address write command to be mentioned later) cycle synchronizing with the leading edge of the clock signal CLK (internal clock). Moreover, a column address thus defined serves as the start address of a burst access.

The address signal, clock signal, each control signal, and data input/output signal use a small-amplitude interface such as the SSTL or GTL. That is, the address buffer, clock buffer, control input buffer, and data input buffer use differential circuits similar to those of the above embodiment, and an electrostatic protection circuit similar to that of the above embodiment and a dummy circuit analogous to the electrostatic protection circuit are added to the input of the differential circuit.

Then, main operation modes of an SDRAM ordered by commands will be described below.

(1) Mode register setting command (Mo)

This is a command for setting the mode register 30 and it is set by /CS, /RAS, /CAS, or /WE=low level, and data to be set (register set data) is supplied through A0 to A11. Though not restricted, the register set data is used for a burst length, CAS latency, or write mode. Though not restricted, burst lengths which can be set are 1, 2, 4, 8, and full-page, CAS latencies which can be set are 1, 2, and 3, and write modes which can be set are burst write and single write.

The CAS latency orders the number of cycles of an internal clock consumed between the fall of /CAS and the output operation of the output buffer 211. Because an internal operation time taken to read data is necessary until read data is determined and therefore, the CAS latency is used to set the time in accordance with the operating frequency of the internal clock. In other words, the CAS latency is set at a relatively large value when using a high-frequency internal clock and set at a relatively small value when using a low-frequency internal clock signal. Though not restricted, in the case of the image processing to be mentioned later, it is possible to set the CAS latency at a large value if necessary in order to ensure a word-ling switching time.

(2) Row-address-strobe bank active command (Ac)

This is a command for effectively selecting a memory bank in accordance with the designation of a row address strobe and A11, which is designated by /CS or /RAS=low level, or /CAS or /WE=high level. In this case, the addresses to be supplied to A0 to A11 is captured as a row address signal and a signal to be supplied to A11 is captured as a memory bank selection signal. The capture operation is performed in synchronizm with the leading edge of an internal clock signal as described above. For example, when the command is specified, a word line of a memory bank specified by the command is selected and memory cells connected to the word line are electrically connected to their corresponding complementary data lines respectively.

(3) Column address read command (Re)

This is a command necessary to start the burst read operation and also give an instruction to a column address strobe, which is given by /CS or /CAS=low level, or /RAS or /WE=high level. In this case, the column address to be supplied to A0 to A8 is captured as a column address signal.

Thereby, the captured column address signal is supplied to the column address counter 207 as a burst start address. In the case of the burst read operation ordered by this, because a memory bank and a word line of the bank are previously selected in the row-address-strobe bank active command cycle, memory cells of the selected word line are successively selected in accordance with address signals output from the column address counter 207 synchronously with internal clock signals, and continuously read. The number of continuously read data values is equal to the number of data values specified by the burst length. Moreover, read of data from the output buffer 211 is started by waiting for the number of cycles of an internal clock designated by the CAS latency.

(4) Column address write command (Wr)

This is a command necessary to start the burst write operation when mode register burst write is set up as a mode of the write operation and moreover, a command necessary to start the single write operation when mode register single write is set up as the mode of the write operation. Moreover, the command is a command of a column address strobe for single write and burst write. The command is designated by /CS, /CAS, or /WE=low level, or /RAS=high level. In this case, the address to be supplied from A0 to A8 is captured as a column address signal. The column address signal thus captured is supplied to the column address counter 207 as a burst start address for burst write. The procedure of the burst write operation thus ordered is also executed similarly to the case of the burst read operation. However, there is no CAS latency for the write operation. Therefore, capture of write data is started with the column address command cycle.

(5) Precharge command (Pr)

This is a command to start the precharge operation of a memory bank selected by A10 or A11, which is designated by /CS, /RAS, or /WE=low level, or /CAS=high level.

(6) Auto refresh command

This is a command necessary to start auto refresh, which is designated by /CS, /RAS, or /CAS=low level, or /WE or CKE=high level.

(7) Burst stop in full-page command

This is a command necessary to stop the burst operation for full-page on every memory bank. The burst operation other than full-page is ignored. This command is designated by /CS or /WE=low level, or /RAS or /CAS=high level.

(8) No-operation command (Nop)

This is a command to perform no substantial operation, which is designated by /CS=low level or /RAS, /CAS, or /WE=high level.

In the case of an SDRAM, while the burst operation is performed in one memory bank, if another memory bank is specified and a row-address-strobe bank active command is supplied, the row-address-system operation of the latter memory bank is enabled without influencing the former memory bank under execution. For example, the SDRAM has means for holding data, address, and control signal supplied from an external unit and the contents held, particularly the address and control signal are held by each memory bank though not restricted. Alternatively, the data for one word line in a memory block selected in the row-address-strobe bank active command cycle is previously latched by a not-illustrated circuit for the read operation before the column-system operation is performed.

Therefore, as long as data values do not collide with each other in data input/output terminals I/O0 to I/O7, it is possible to previously start the internal operation during the unfinished operation ordered by the command by issuing a precharge command and a row-address-strobe bank active command to the memory bank different from the memory bank accessed by the command whose processing is not ended.

An SDRAM can be defined as a memory which can input or output data, addresses, or such various control signals as /RAS and /CAS synchronously with an internal clock signal generated in accordance with an external clock signal CLK. An SDRAM makes it possible to operate a large-capacity memory such as a DRAM at a high speed equal to the operation speed of an SRAM (static RAM) and moreover, continuously read or write a plurality of data values by specifying the number of data values to be accessed to one selected word line with a burst length and thereby, successively switching the column-system selection state by means of the built-in column address counter 207. Therefore, by using such a small-amplitude interface, it is possible to read or write the data at high speed exceeding 100 MHz.

The following functions and advantages are obtained from the above embodiments.

(1) By using an input circuit constituted as a single-input differential circuit including a first MOSFET to whose gate a reception signal whose amplitude is reduced compared to a power supply voltage is supplied and a second MOSFET to whose gate a reference voltage corresponding to an intermediate value of the reception signal is supplied and providing in the input circuit a dummy circuit for transmitting substantially the same power supply noise as the power supply noise transmitted to the gate of the first MOSFET to the gate of the second MOSFET through a substantial electrostatic protection circuit provided to an external terminal for receiving the reception signal, an advantage is obtained that the power supply noise can be offset or reduced.

(2) A part of the electrostatic protection circuit uses circuit elements constituted on a semiconductor substrate to form an output circuit. Thus, an advantage is obtained that noise can be effectively offset or reduced in the dummy circuit described in the above Item (1) by providing a dummy MOSFET which corresponds to the circuit element of the output circuit, whose element size is reduced and which is made off.

(3) A plurality of such input circuits are used. Thus, an advantage is obtained that the reference voltage can be prevented from being influenced by noise by supplying the reference voltage to the second MOSFET of each input circuit through a resistive element.

(4) An advantage is obtained that the level margin of a single differential input circuit adapted to a stub series terminated logic for 3.3 V can be ensured.

The inventions made by the present inventor have been specifically described above with reference to the embodiments. However, the present invention is not restricted to the embodiments. It is needless to say that various modifications of the present invention may be made as long as the modifications do not depart from the gist of the present invention. For example, it is possible to supply all the small-amplitude signals input to a semiconductor integrated circuit to the single-input differential amplifying circuit or receive part of the signals such as clocks at the differential circuit by inputting complementary signals. In the case of the complementary-input differential amplifying circuit, a dummy circuit is unnecessary because an electrostatic protection circuit is provided for each input. A small-amplitude interface is widely used not only for the SSTL and GTL but also for circuits such as a pseudo ECL circuit for transmitting signals at a signal amplitude decreased with respect to the operating power supply voltage.

The present invention can be widely used for various digital integrated circuits provided with an input circuit to which a signal with a small amplitude decreased with respect to the operating power supply voltage is single-input and various semiconductor integrated circuits including memories such as a synchronous DRAM and a microprocessor.

An advantage obtained from typical one of the inventions disclosed in this application will be briefly described below. That is, by using an input circuit constituted as a single-input differential circuit including a first MOSFET to whose gate a reception signal with a small amplitude with respect to a power supply voltage is supplied and a second MOSFET to whose gate a reference voltage corresponding to an intermediate value of the reception signal is supplied and providing in the input circuit a dummy circuit for transmitting substantially the same power supply noise as the power supply noise transmitted to the gate of the first MOSFET to the gate of the second MOSFET through a substantial electrostatic protection circuit provided to an external terminal for receiving the reception signal, it is possible to offset or reduce the power supply noise.

What is claimed is:

1. A semiconductor integrated circuit comprising:

an input circuit which includes a first MOSFET of a first conductivity type having a gate to which a reception signal with a small amplitude with respect to a power supply voltage is supplied through an external terminal, a second MOSFET of the first conductivity type having a gate to which a reference voltage corresponding to a value which judges logic levels of said reception signal is applied, and third and fourth MOSFETs of a second conductivity type provided to drains of said first and said second MOSFETs, respectively, and formed into current mirror forms, to generate an output signal corresponding to a difference current between drain currents of said first and said second MOSFETs;

an electrostatic protection circuit provided to the external terminal which receives said reception signal; and a first circuit provided to the gate of said second MOSFET, and adapted to transmit the same noise as a noise on a power supply transmitted to the gate of said first MOSFET through said electrostatic protection circuit, to the gate of said second MOSFET;

wherein sources of said first and said second MOSFETs are connected in common so as to be in a differential form and said common source is provided with a fifth MOSFET of a first conductivity type for supplying an operating current; and wherein said electrostatic protection circuit includes a first diode provided between a power supply voltage terminal and said external terminal in a reversely biased state and a second diode provided between said external terminal and an earth potential of the semiconductor integrated circuit in a reversely biased state and said first circuit includes third and fourth diodes being of sizes smaller than sizes of said first and said second diodes.

2. The semiconductor integrated circuit according to claim 1, further comprising:

an output circuit having output terminals connected to said external terminal in common, wherein said electrostatic protection circuit includes a parasitic element in an off state of an output MOSFET constituting said output circuit, and said first circuit corresponds to said output MOSFET and includes a sixth MOSFET whose element size is smaller than that of the output MOSFET and which is off.

3. The semiconductor integrated circuit according to claim 1, further comprising:

a part of said electrostatic protection circuit uses a circuit element constituted on a semiconductor substrate to form an output circuit having an output MOSFET, and said first circuit corresponds to the circuit element of said output circuit and includes a sixth MOSFET whose element size is smaller than that of the output MOSFET and which is off.

4. A semiconductor integrated circuit comprising:

an input circuit which includes a first MOSFET of a first conductivity type to whose gate a reception signal with a small amplitude with respect to a power supply voltage is supplied through an external terminal, a second MOSFET of the first conductivity type to whose gate a reference voltage corresponding to a value which judges logic levels of said reception signal is applied, and third and fourth MOSFETs of a second conductivity type provided to the drains of said first and second MOSFETs and formed into current mirrors, to generate an output signal corresponding to a difference current between drain currents of said first and said second MOSFETs;

an electrostatic protection circuit provided to the external terminal which receives said reception signal;

a circuit provided to the gate of said second MOSFET, and adapted to transmit substantially the same noise as a noise on a power supply transmitted to the gate of said first MOSFET through said electrostatic protection circuit, to the gate of said second MOSFET; and an output circuit having an output terminal which is to said external terminal, wherein sources of said first and said second MOSFETs are so connected in common as to be in a differential form and said common source is provided with a MOSFET of a first conductivity type for supplying an operating current, wherein said electrostatic protection circuit includes a parasitic element in an off state of an output MOSFET of said output circuit, and wherein said circuit includes a fifth MOSFET whose element size is smaller than that of the output MOSFET and which is off, and which corresponds to said output MOSFET.

5. A semiconductor integrated circuit comprising:

an input circuit which includes a first MOSFET of a first conductivity type to whose gate a reception signal with a small amplitude with respect to a power supply voltage is supplied through an external terminal, a second MOSFET of the first conductivity type to whose gate a reference voltage corresponding to a value which judges logic levels of said reception signal is applied, and third and fourth MOSFETs of a second conductivity type provided to the drains of said first and second MOSFETs and formed into current mirrors, to generate an output signal corresponding to a difference current between drain currents of said first and said second MOSFETs;

an electrostatic protection circuit provided to the external terminal which receives said reception signal; and a circuit provided to the gate of said second MOSFET, and adapted to transmit substantially the same noise as a noise on a power supply transmitted to the gate of said first MOSFET through said electrostatic protection circuit, to the gate of said second MOSFET, wherein sources of said first and said second MOSFETs are so connected in common as to be in a differential form and said common source is provided with a MOSFET of a first conductivity type for supplying an operating current, and wherein a part of said electrostatic protection circuit uses a circuit element formed on a semiconductor substrate to form an output circuit having an output MOSFET, and said circuit corresponds to the circuit element of said output circuit and includes a fifth MOSFET whose element size is smaller than that of the output MOSFET and which is off.

6. A semiconductor integrated circuit comprising:

an input circuit which includes a first MOSFET of a first conductivity type to whose gate a reception signal with a small amplitude with respect to a power supply voltage is supplied through an external terminal, a second MOSFET of the first conductivity type to whose gate a reference voltage corresponding to a value which judges logic levels of said reception signal is applied, and third and fourth MOSFETs of a second conductivity type provided to the drains of said first and second MOSFETs and formed into current mirrors, to generate an output signal corresponding to a difference current between drain currents of said first and said second MOSFETs;

an electrostatic protection circuit provided to the external terminal which receives said reception signal; and a circuit provided to the gate of said second MOSFET, and adapted to transmit substantially the same noise as a noise on a power supply transmitted to the gate of said first MOSFET through said electrostatic protection circuit, to the gate of said second MOSFET, wherein sources of said first and said second MOSFETs are so connected as to be in a differential form and said common source is provided with a MOSFET of a first conductivity type for supplying an operating current, and wherein a plurality of said input circuits are used, and said reference voltage is applied to the gate of said second MOSFET of each input circuit through a resistive element.

* * * * *